United States Patent
Klimov et al.

(10) Patent No.: US 6,819,692 B2
(45) Date of Patent: Nov. 16, 2004

(54) OPTICAL AMPLIFIERS AND LASERS

(75) Inventors: Victor I. Klimov, Los Alamos, NM (US); Alexandre Mikhailovski, Los Alamos, NM (US); Jennifer A. Hollingsworth, Los Alamos, NM (US); Catherine A. Leatherdale, St. Paul, MN (US); Moungi G. Bawendi, Boston, MA (US)

(73) Assignees: Massachusetts Institute of Technology, Cambridge, MA (US); Regents of the University of California, Los Alamos, NM (US)

( * ) Notice: Subject to any disclaimer, the term of this patent is extended or adjusted under 35 U.S.C. 154(b) by 69 days.

(21) Appl. No.: 09/805,435

(22) Filed: Mar. 14, 2001

(65) Prior Publication Data

US 2001/0046244 A1 Nov. 29, 2001

Related U.S. Application Data

(60) Provisional application No. 60/189,256, filed on Mar. 14, 2000.

(51) Int. Cl.[7] .............................. H01S 3/14; H01S 5/00; H01S 3/091
(52) U.S. Cl. .............................. 372/39; 372/43; 372/70
(58) Field of Search ........................ 372/39, 43, 45–46, 372/70–75

(56) References Cited

U.S. PATENT DOCUMENTS

| 5,260,957 A | * | 11/1993 | Hakimi et al. ................. 372/39 |
| 5,262,357 A | | 11/1993 | Alivisatos et al. |
| 5,293,050 A | | 3/1994 | Chapple-Sokol et al. |
| 5,354,707 A | | 10/1994 | Chapple-Sokol et al. |
| 5,395,791 A | | 3/1995 | Cheng et al. |
| 5,422,489 A | | 6/1995 | Bhargava |
| 5,492,080 A | | 2/1996 | Ohkawa et al. |
| 5,499,260 A | | 3/1996 | Takahashi et al. |
| 5,505,928 A | | 4/1996 | Alivisatos et al. |
| 5,515,393 A | | 5/1996 | Okuyama et al. |
| 5,525,377 A | | 6/1996 | Gallagher et al. |
| 5,537,000 A | | 7/1996 | Alivisatos |
| 5,541,948 A | | 7/1996 | Krupke et al. |
| 5,585,640 A | | 12/1996 | Huston et al. |
| 5,625,456 A | | 4/1997 | Lawandy |
| 5,674,698 A | | 10/1997 | Zarling et al. |

(List continued on next page.)

FOREIGN PATENT DOCUMENTS

| WO | WO 98/04740 | 2/1998 |
| WO | WO 98/19963 | 5/1998 |
| WO | WO 98/33070 | 7/1998 |
| WO | WO 98/36376 | 8/1998 |
| WO | WO 99/19515 | 4/1999 |
| WO | WO 99/26299 | 6/1999 |
| WO | WO 99/50916 | 10/1999 |
| WO | WO 00/17655 | 3/2000 |
| WO | WO 00/17656 | 3/2000 |
| WO | WO 00/27365 | 5/2000 |
| WO | WO 00/27436 | 5/2000 |
| WO | WO 00/28088 | 5/2000 |
| WO | WO 01/07689 | 1/2001 |
| WO | WO 00/48275 | 11/2001 |

OTHER PUBLICATIONS

Alivisatos, "Perspectives on the Physical Chemistry of Semiconductor Nanocrystals", J. Phys. Chem., vol. 100, No. 31, pp. 13226–13239, (1996).
Alivisatos, "Semiconductor Clusters, Nanocrystals, and Quantum Dots," Science, 271, pp. 933–937, (1996).
Bawendi, et al., "Luminescence properties of CdSe quantum crystallites: Resonance between interior and surface localized states", J. Chem. Phys., 96(2), pp. 946–954, (Jan. 1, 1992).

(List continued on next page.)

Primary Examiner—Don Wong
Assistant Examiner—James Menefee
(74) Attorney, Agent, or Firm—Steptoe & Johnson LLP (57) ABSTRACT

An optical amplifier and laser having both broad band and wide range specific band capability can be based on semiconductor nanocrystal solids.

50 Claims, 7 Drawing Sheets

U.S. PATENT DOCUMENTS

| | | | |
|---|---|---|---|
| 5,721,099 A | | 2/1998 | Still et al. |
| 5,736,330 A | | 4/1998 | Fulton |
| 5,747,180 A | | 5/1998 | Miller et al. |
| 5,751,018 A | | 5/1998 | Alivisatos et al. |
| 5,881,200 A | | 3/1999 | Burt |
| 5,990,479 A | | 11/1999 | Weiss et al. |
| 6,057,561 A | * | 5/2000 | Kawasaki et al. ............ 257/94 |
| 6,207,229 B1 | | 3/2001 | Bawendi et al. |
| 6,251,303 B1 | | 6/2001 | Bawendi et al. |
| 6,322,901 B1 | * | 11/2001 | Bawendi et al. ............ 428/548 |

OTHER PUBLICATIONS

Bruchez et al., "Semiconductor nanocrystals as fluorescent probes for biology," Cytometry, Supplement 9, p. 26, (Mar., 1998).

Colvin et al., "Light–emitting diodes made from cadmium selenide nanocrystals and a semiconducting polymer" Nature, 370(6488):354–357, (Aug. 4, 1994).

Correa–Duarte et al., "Stabilization of CdS semiconductor nanoparticles against photodegradation by a silica coating procedure," Chemical Physics Letters, 286, pp. 497–501 (1998).

Dabbousi et al., "(CdSe)ZnS Core–Shell Quantum Dots: Synthesis and Characterization of a Size Series of Highly Luminescent Nanocrystallites," The Journal of Physical Chemistry B, 101(46), pp. 9463–9475 (1997).

Dabbousi et al., "Electroluminescence from CdSe quantum–dot/polymer composites," Appl. Phys. Lett., 66 (11), pp. 1316–1318, (1995).

Danek et al., "Synthesis of Luminescent Thin–Film CdSeZnSe Quantum Dot Composites Using CdSe Quantum Dots Passivity with an Over layer of ZnS," Chem. Mater., 8(1), pp. 173–180, (1996).

Empedocles, et al., "Photoluminescence Spectroscopy of Single CdSe Nanocrystallite Quantum Dots", Physical Review Letters, vol. 77, No. 18, pp. 3873–3876, (1996).

Empedocles, et al., Quantum–Confined Stark Effect in single CdSe Nanocrystallite Quantum Dots:, Sciente, vol. 278, pp. 2114–2117, (1997).

Gan, et al., "Enhanced Photoluminescence and Characterization of Mn–Doped ZnS Nanocrystallites Synthesized in Microemulsion", American Chemical Society, Langmuir, vol.. 13, No. 24, pp. 6427–6431, (1997).

Gao et al., "Strongly Photoluminescent CdTe Nanocrystals by Proper Surface Modification," J. Phys. Chem., vol. 102, pp. 8360–8363, (1998).

Ginsdele, et al., "Optical gain and high quantum efficiency of matrix–free, closely packed CdSe quantum dots", Appl. Phys. Lett., 71(15), pp. 2181–2183, (Oct. 13, 1997.

Green, et al., "Recent advances in the preparation of semiconductors as isolated nanometric particles; new routes to quantum dots", Chem. Commun., pp. 2235–2241, (1999).

Guha et al., "Hybrid organic–inorganic semiconductor–based light–emitting diodes" J. Appl. Phys., 82(8), pp. 4126–4128, (Oct. 15, 1997).

Hines et al., "Synthesis and Characterization of Strongly Luminescing ZnS–Capped CdSe Nanocrystals," J. Phys. Chem. 100, pp. 468–471 (1996).

Jarvis, Jr. et al., "Solution Sythesis and Photoluminescence Studies of SMA Crystallites of Cadmium Telluride," Mat. Res. Soc. Symp. Proc. 272, pp. 227–234 (1992).

Kagan et al., "Electronic Energy Transfer in CdSe Quantum Dot Solids," Physical Review Letters, 76, pp. 1517–1520, (Feb. 26, 1996).

Kagan et al., "Long–range resonance transfer of electronic excitations in close–packed CdSe quantum–dot solids," Physical Review Letters, 54, pp. 8633–8643, (Sep. 15, 1996).

Klimov, et al., "Ultrafast dynamics of inter– and intraband transitions in semiconductor nanocrystals: Implications for quantum–dot lasers", Physical Review B, vol. 60, No. 4, pp. 2177–2180, (Jul., 15, 1999).

Klimov, et al., "Quantization of Multiparticle Auger Rates in Semiconductor Quantum Dots", Science, vol. 287, pp. 1011–1013, (Feb. 11, 2000).

Kuno, et al., "The band edge luminescence of surface modified DcSe nanocrystallites: Probing the luminescing state", J. Chem. Phys. 106(23), pp. 9869–9882, (Jun. 15, 1997).

Leatherdale, et al., "Photoconductivity in DcSe quantum dot solids", vol. 62, No. 4, pp. 2669–2680, (Jul. 15, 2000).

Lee et al., "Surface Derivatizations of Nanocrystalline CdSe Semiconductors," Mat. Res. Soc. Symp. Proc. 452, pp. 323–328, (1997).

Lett, D. N., "Color–Coding Quantum Dots Debut With Promising Careers In Clinical Diagnostics Field", BioWorld Today, vol. 9, No. 185, p. 1, (1998).

Liz–Marzán, et al., "Sythesis of Nanosized Gold–Silica Core–Shell Particles," Langmuir 12, pp. 4329–4335, (1996).

Ludolph et al., "Novel single molecule precursor routes for the direct synthesis of highly monodispersed quantum dots of cadmium or zinc sulfide or selenide", Chem. Commun., pp. 1849–1850, (1998).

Malik, et al., "Semiconductor nanoparticles: their properties, synthesis and potential for application", South African Journal of Science, 96, pp. 55–60. (2000).

Michael, et al., "Randomly Ordered Addressable High–Density Optical Sensor Arrays", Analytical Chemistry, vol. 70, No. 7, pp. 1242–1248, (Apr. 7, 1998).

Mikulec et al., "Synthesis and Characterization of Highly Luminescent (CdSe)ZnS Quantum Dots," Materials Research Society Symposium, 452, pp. 359–364, (1997).

Müllenborn et al., "Characterization of Solution–Synthesized CdTe and HgTe," Applied Physics, 56, pp. 317–321, (1993).

Murray et al., "Synthesis and Characterization of Nearly Monodiperse CdE (E=S, Se, Te) Semiconductor Nanocrystallites", J. Am. Chem. Soc., vol. 115, No. 19, pp. 8706–8715, (1993).

Nirmal et al., "Fluorescence intermittency in single cadmium selenide nanocrystals", Nature, vol. 383, pp. 802–804, (Oct. 31, 1996).

Nozik et al., "Colloidal Quantum Dots of III–V Semiconductors," MRS Bulletin, 23(2), pp. 24–30 (1998).

Pehnt et al., "Nanoparticle Precursor Route to Low–Temperature Spray Deposition of CdTe Thin Films," Appl. Phys. Lett, 67(15), pp. 2176–2178, (Oct. 9, 1995).

Peng, et al., "Epitaxial Growth of Highly Luminescent CdSe/CdS Core/Shell Nanocrystals with Photostability and Electronic Accessibility," J. Am. Chem. Soc., 119, pp. 7019–7029, (1997).

Rogach et al., "Synthesis and characterization of Thiol–Stabilized CdTe Nanocrystals" Ber. Bunsenges. Phys. Chem., 100(11), pp. 1772–2778, (1996).

Spanhel et al., "Photochemistry of Colloidal Semiconductors. Surface Modification and Stability of Strong Luminescing CdS Particles", J. Am. Chem. Soc., 109 (19), pp. 5649–5655, (1987).

* cited by examiner

OPTICAL AMPLIFIERS AND LASERS

CLAIM OF PRIORITY

This application claims priority under to U.S. patent application Ser. No. 60/189,256, filed on Mar. 14, 2000, the entire contents of which are hereby incorporated by reference.

FEDERALLY SPONSORED RESEARCH OR DEVELOPMENT

The U.S. Government may have certain rights in this invention pursuant to Contract No. W-7405-ENG-36 awarded by the U.S. Department of Energy and Grant Number DMR-9872996 awarded by the National Science Foundation.

TECHNICAL FIELD

The present invention relates to improved optical amplifiers and lasers having both broad band and wide range specific band capability, and more particularly to an optical amplifier and laser based on solids containing semiconductor nanocrystals.

BACKGROUND

Optical amplifiers utilize a gain medium to amplify optical radiation. In an amplifier, a source excites the gain medium to produce a population inversion between high and low energy states of the gain medium. The excited gain medium can amplify optical radiation at energies overlapping the energy differences between the high and low energy states of the population inversion because stimulated emission of radiation from the medium is more efficient than absorption of light. In general, a laser utilizes a cavity to supply feedback to an excited gain medium to cause amplified spontaneous emission. A laser cavity can include a series of optical components, such as mirrors, arranged relative to the gain medium to reflect radiation back into the cavity and thereby provide feedback. For example, a gain medium can be placed into a stable or unstable resonator. Alternatively, amplified spontaneous emission can occur in an excited gain medium without external optical components if the gain medium has a length, L, and gain coefficient, G (cm$^{-1}$) sufficient to satisfy the expression:

$$G L \gg 1$$

where the gain coefficient, G, is related to the stimulated emission cross section and the difference in the population densities of the high and low energy states generated by the population inversion.

Conventional solid-state and gas lasers and amplifiers generally provide very specific spectral outputs depending upon the laser material. If a spectral output other than that achievable with available gain materials or a less specific spectral output is desired, dye lasers or tunable optical parametric oscillators (OPO) or amplifiers (OPA) can be used. Dye lasers are large and bulky and also require fluid components that can be toxic.

SUMMARY

In general, a gain media includes a plurality of semiconductor nanocrystals. The gain medium can be used to amplify optical radiation or produce optical radiation by lasing. In particular, the gain medium includes concentrated solids of semiconductor nanocrystals, such as close-packed films of semiconductor nanocrystals, that provide high gain to produce optical amplification or lasing over short amplifier or cavity lengths.

In one aspect, a gain medium includes a concentrated solid having a plurality of semiconductor nanocrystals.

In another aspect, a laser includes an optical gain medium and a cavity arranged relative to the optical gain medium to provide feedback. The optical gain medium includes a concentrated solid having a plurality of semiconductor nanocrystals. The cavity can be a microcavity. For example, the cavity can have a length that is less than 1 mm.

In another aspect, a method of amplifying an optical signal includes directing an optical beam into a concentrated solid including a plurality of semiconductor nanocrystals.

In another aspect, a method of forming a laser includes arranging a cavity relative to an optical gain medium to provide feedback to the optical gain medium. The optical gain medium includes a concentrated solid including a semiconductor plurality of nanocrystals.

The concentrated solid can be substantially free of defects. A concentrated solid including defects produces loses, such as scatter, such that the solid does not provide gain to optical radiation. The solid can provide gain to an optical signal at an energy equal to or less than the maximum band gap emission of the nanocrystals. The solid also is capable of providing gain at energies in which a concentrated solid is substantially free of absorption.

Concentrated solids include greater than 0.2%, greater than 5%, greater than 10%, or greater than 15% by volume semiconductor nanocrystals. The each of the plurality of semiconductor nanocrystals includes a same or different first semiconductor material. The first semiconductor material can be a Group II–VI compound, a Group II–V compound, a Group III–VI compound, a Group III–V compound, a Group IV–VI compound, a Group I–III–VI compound, a Group II–IV–VI compound, or a Group II–IV–V compound, such as, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. Each first semiconductor material is overcoated with a second semiconductor material, such as ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. Each first semiconductor material has a first band gap and each second semiconductor material has a second band gap that is larger than the first band gap. Each nanocrystal can have a diameter of less than about 10 nanometers. The plurality of nanocrystals have a monodisperse distribution of sizes. The plurality of nanocrystals have a plurality of monodisperse distribution of sizes. The plurality of monodisperse distribution of sizes can provide gain over a broad range of energies or over a plurality of narrow ranges, e.g., a FWHM of gain less than 75 nm, in which the gain maxima occur at a separate energy such that at least some of the narrow ranges do not overlap in energy. The concentrated solid of nanocrystals is disposed on a substrate such as glass. The concentrated solid of nanocrystals has a thickness greater than about 0.2 microns.

Optical gain from gain media including semiconductor nanocrystals occurs at excitation densities in excess of only one electron-hole (e-h) pair per nanocrystal. The semiconductor nanocrystals provide wide-range of tunable optical properties, e.g., emission and absorption wavelengths. The nanocrystals exhibit discrete atomic-like optical transitions in linear absorption and size dependent photoluminescence (PL), e.g., emission, spectra. The photoluminescence properties are tuned by changing the size of the semiconductor nanocrystal to change the semiconductor energy-gap. The semiconductor energy-gap increases, from a bulk semiconductor value, inversely with the radius (R) of the nanocrystal according to $1/R^2$. For example, the band gap in CdSe quantum dots can be changed from 1.7 eV (deep red) to 3.2 eV (ultraviolet) by reducing the dot radius from 10 nanometers (nm) to 0.7 nm. The semiconductor nanocrystals are synthesized with R between about 1 nm to 15 nm, e.g., less than 10 nm, with less than about 5 percent size dispersion. Semiconductor nanocrystals having a modified surface (e.g., by overcoating the nanocrystal with a shell of a wide-gap semiconductor) allow significant suppression of carrier surface trapping, to the enhance the room-temperature PL quantum efficiency up to 50 percent and higher. Gain media including semiconductor nanocrystals are produced quickly and at low cost. The semiconductor nanocrystals can be used in optical waveguide materials for optically interconnecting integrated circuits. Without needing optical and electro-optical tuning and filtering systems, gain media including different semiconductor nanocrystals, different sizes of semiconductor nanocrystals, or both, can provide optical gain at very broad bandwidth (i.e., a broad band of radiation energies), narrow bandwidth (i.e., a narrow band of radiation energies), or a plurality of narrow or broad bands at different radiation energies (i.e., the bands do not necessarily overlap in energy).

Other features, objects, and advantages will be apparent from the description and drawings, and from the claims.

DESCRIPTION OF DRAWINGS

Like reference symbols in the various drawings indicate like elements.

DETAILED DESCRIPTION

Amplifiers and lasers include gain media for amplifying radiation or producing radiation by lasing. The gain medium can include a plurality of semiconductor nanocrystals. The nanocrystals can be illuminated with a light source at an absorption wavelength to cause an emission at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include Group II–VI compounds, Group II–V compounds, Group III–VI compounds, Group III–V compounds, Group IV–VI compounds, Group I–III–VI compounds, Group II–IV–VI compounds, and Group II–IV–V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. application Ser. No. 08/969,302, incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis (silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis (trimethylsilyl)sulfide (($TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP) and tri-n-octyl phosphine oxide (TOPO). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 400 nm to 800 nm. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II–VI compounds, Group II–V compounds, Group III–VI compounds, Group III–V compounds, Group IV–VI compounds, Group I–III–VI compounds, Group II–IV–VI compounds, and Group II–IV–V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. application Ser. No. 08/969, 302, incorporated herein by reference in its entirety. By adjusting the temperature of the reaction mixture during overcoating and monitoring the absorption spectrum of the core, over coated materials having high emission quantum efficiencies and narrow size distributions can be obtained.

The particle size distribution can be further refined by size selective precipitation with a poor solvent for the nanocrystals, such as methanol/butanol as described in U.S. application Ser. No. 08/969,302, incorporated herein by reference. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/ hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

The semiconductor nanocrystals can be formed into concentrated solids of nanocrystals such as close-packed nanocrystals. The close-packed nanocrystals can form a concentrated solid including greater than 0.2%, greater than 10%, greater than 15%, between 16% and 67%, or between 18% and 20% by volume, semiconductor nanocrystals. A critical density of nanocrystals (critical volume fraction ξ) required for development of stimulated emission (SE) can be calculated as follows. Development of SE is possible if $$\tau_{st} < \tau_{nr} \quad (1)$$

where $\tau_{st}$ is the buildup time of stimulated emission and $\tau_{nr}$ is the characteristic time of carrier nonradiative decay. The stimulated emission buildup time is inversely proportional to the gain magnitude: $\tau_{st}=n_r/(Gc)$, where c is the light velocity and $n_r$ is the sample reflection index. This expression can further be rewritten in terms of gain cross section ($\sigma_g=G/n_0$, where $n_0$ is the nanocrystal density in the sample) and the volume fraction of semiconductor in the sample ($\xi=v_0 n_0$, where $v_0$ is the volume of a single nanocrystal): $\tau_{st}=v_0 n_r/(\xi\sigma_g c)$. Using Eq. (1), the critical volume fraction of the semiconductor in the sample required for development of SE can be expressed as:

$$\xi > v_0 n_r/(\sigma_g c \tau_{nr}) \quad (2)$$

$\xi$ decreases with increasing the gain cross section (gain per nanocrystal) and increasing the time constant of the nonradiative carrier decay (i.e., decreasing the rate of nonradiative carrier losses). In nanocrystals, the time of nonradiative decay, $\tau_{nr}$, is the shorter between the time of surface trapping and the time of the Auger recombination. For well passivated CdSe nanocrystals, $\tau_{nr}$ is dominated by the Auger decay for which $\tau_{nr}=\beta R^3$ with $\beta \approx 5$ ps $nm^{-3}$. For $\sigma_g \approx 10^{-17}$ $cm^2$ measured for 1.3 nm radius CdSe nanocrystals, Eq. (2) yields $\xi > 0.2\%$.

The concentrated solid is substantially free of defects such that the films provide gain to optical radiation when excited by a source. Nanocrystal solids containing defects, i.e., those films not substantially free of defects, generate losses, e.g., scatter, such that the films do not generate gain in optical radiation when excited with a source. The thickness of the film can be, generally, between about 0.2 microns to 10 microns.

Concentrated solids of nanocrystals can be formed by redispersing the powder semiconductor nanocrystals described above in a solvent system and drop casting films of the nanocrystals from the dispersion. The solvent system for drop casting depends on the chemical character of the outer surface of the nanocrystal, i.e., whether or not the nanocrystal is readily dispersible in the solvent system. For example, a 9:1 hexane/octane solvent system can be used to drop cast films of nanocrystals having a surface modified with tributylphosphine (TBP)/tributylphosphine oxide (TBPO). Nanocrystals having a pyridine surface can be drop cast from a 9:1 methanol/pyridine solvent system. The drop cast films are dried in an inert atmosphere for about 12 to 24 hours before being dried under vacuum. Typically, the films are formed on substrates. The substrate can be made from any material that does not react with the nanocrystals. The substrate can be selected such that it is opaque or transparent at specific energies of optical radiation. The substrate can be formed in a variety of shapes. Examples of substrate materials include sapphire and silicon. Prior to receiving the film, a substrate can be cleaned by oxygen plasma to remove surface organic contaminants. Alternatively, silicon substrates can be prepared for drop casting by boiling them in ultra-pure water and drying them at about 175° C. to increase the hydrophilicity of the substrate's surface.

Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum. Solid nanocrystal thicknesses can be determined using an ultraviolet/visible spectrometer by measuring the optical absorption of the nanocrystal solid and applying Beer's law.

Pump-probe laser experiments, such as transient absorption femtosecond laser experiments, can be used to determine the optical gain of concentrated solids of semiconductor nanocrystals. Concentrated solids of semiconducting nanocrystals, such as close-packed solids, can exhibit gain of optical radiation of about 10 $cm^{-1}$, 25 $cm^{-1}$, 50 $cm^{-1}$, 100 $cm^{-1}$, or 1,000 $cm^{-1}$. The onset of gain in films of semiconductor nanocrystals occurs when a source excites the nanocrystals to produce electron-hole (e-h) pairs in the semiconductor nanocrystal. Gain can be observed in concentrated solids of semiconductor nanocrystals at a range of temperatures (between about 6K to 310K, or above) when the excitation source produces more than about 1.0, 1.5, or 2.0 e-h pairs per semiconductor nanocrystal. Increasing the source power density to increase the number e-h pairs can increase the gain of the film. Although described as optical, the excitation source can electrical. In general, the excitation source should be capable of generating a population inversion of the nanocrystal solid.

Gain in the concentrated solids occurs at energies equal to or lower than the band gap photoluminescence, i.e., emission. For example, the maximum gain can occur at an energy at or below the maximum band gap emission. The energy of the band gap emission, as described above, depends on the semiconductor material and the size of the quantum-confined nanocrystallite. The energy difference between the maximum of the gain and the emission maximum decreases with decreasing size of the nanocrystal.

The concentrated solids of semiconductor nanocrystals can include nanocrystallites of the same size and the same semiconductor materials to produce gain in a narrow band of radiation energies, such as in a band of energies having a FWHM less than about 75 nm. Alternatively, the semiconductor films can be made of different materials, the same material but with different sizes, or both, to produce gain in a broad band of radiation energies or in multiple narrow bands centered at different radiation energies.

Figure 1:
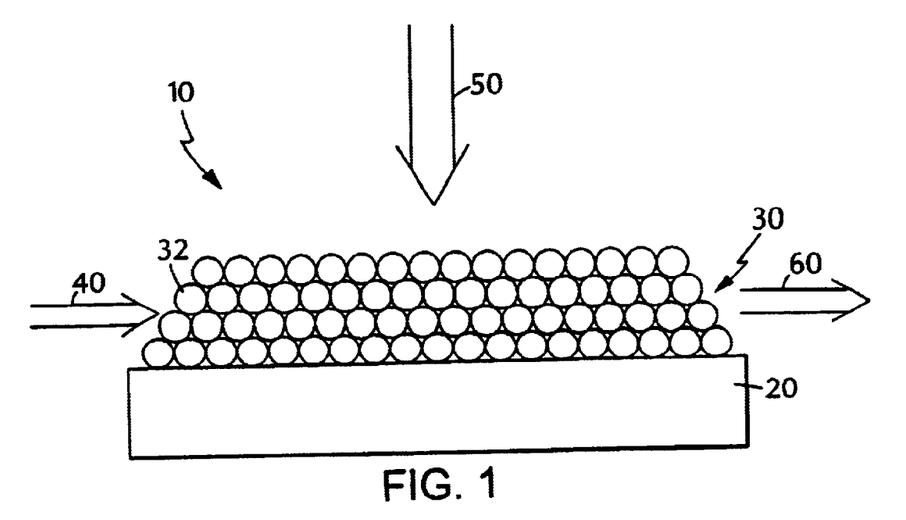
FIG. 1 is a schematic diagram of an amplifier.

Referring to FIG. 1, an amplifier 10 includes a substrate 20 and a gain medium 30. Gain medium 30 includes concentrated solids of nanocrystals 32 formed in a close-packed film. In operation, a user of amplifier 10 directs an input optical radiation beam 40 through gain medium 30 and provides an external optical radiation beam 50 to excite the gain medium to create a population inversion. Provided that the energy of input optical beam 40 overlaps the energies at which gain medium 30 facilitates gain, amplifier 10 amplifies optical beam 40 to produce an amplified output beam 60.

Figure 2:
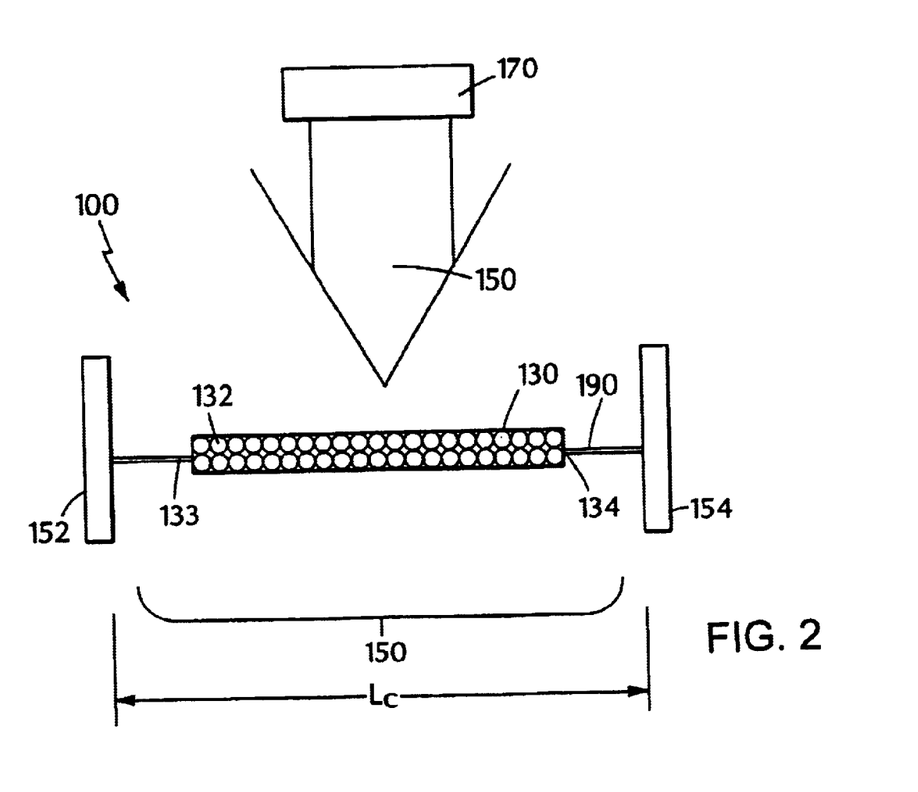
FIG. 2 is a schematic diagram of a laser.

Referring to FIG. 2, a laser 100 includes an excitation source 170 and a gain medium 130 disposed within a cavity 150. Gain medium 130 includes concentrated solids of nanocrystals 132 formed in a close-packed film. Cavity 150 includes two optical components 152, 154, e.g., mirrors, arranged at the ends 132, 134 of gain medium 130 to provide feedback of optical radiation propagating within the gain medium. In operation, excitation source 170 emits an optical radiation signal into cavity 150 to create a population inversion in gain medium 130. Gain medium 130, in turn, spontaneously emits radiation isotropically. Optical components 152, 154 provide positive feedback into cavity 150 by reflecting certain isotropic components of the spontaneously emitted radiation back into the gain medium. The reflected optical radiation confined by cavity 150 propagates through the medium and between the two mirrors until laser 100 reaches threshold, i.e., the rate of stimulated emission exceeds spontaneous emission in gain medium 130, and lasing action generates an optical beam 190. Of course, laser 100 can emit optical beam 190 by appropriately selecting the transmittance of one of the mirrors and the cavity can be formed by any known cavity geometry. For example, the cavity can be formed by more than two optical components.

The spacing between optical components 152, 154 is determined by the rate at which the population inversion decays. In general, the length of a laser cavity, LLC, supplying feedback to the gain media should not exceed a critical length determined by the rate of decay of population in the higher energy states of the gain media. If the length is longer than the critical length, the population inversion disappears before radiation within the gain media or cavity can be amplified. The deactivation of gain media including semiconductor nanocrystals can be determined by measuring the Auger recombination rates of nanocrystals. In general, the Auger recombination rates for CdSe nanocrystals range between about 5 ps to 600 ps. The recombination rates increase with decreasing size of the nanocrystal approximately as $1/R^3$. In order to reach threshold before the gain media deactivates, the cavity lengths of cavity 150 are about a few mm or less. Typically, the cavity is a microcavity having a cavity length less than about 1 mm. Despite the small cavity lengths, gain media including concentrated solids of semiconductor nanocrystals provide a large gain to satisfy the relationship $$G L \gg 1$$

and thereby leading to lasing behavior.

Figure 3A:
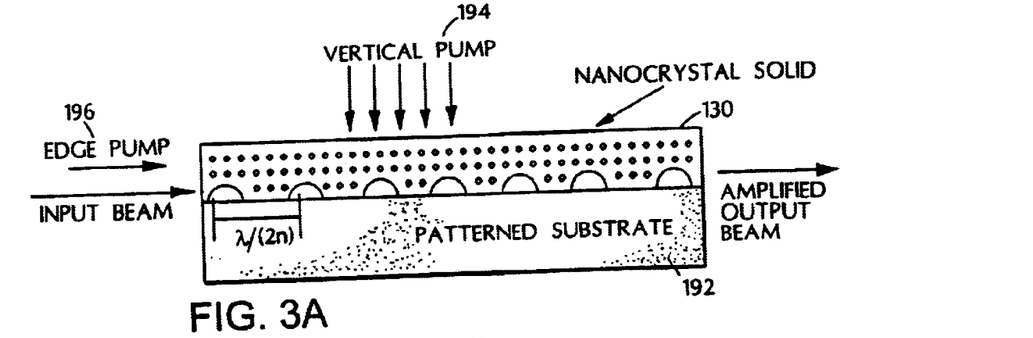
FIGS. 3A and 3B are schematic diagrams of distributed feedback amplifier (3A) and laser (3B).
Figure 3B:
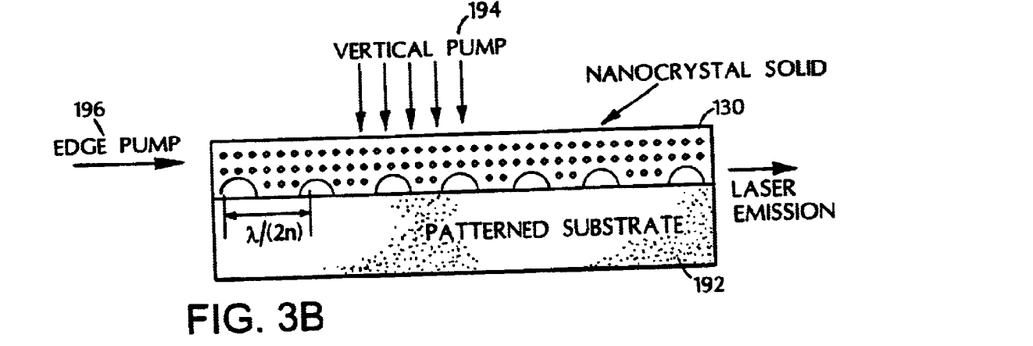

Referring to FIGS. 3A and 3B, a gain medium 130 is deposited on a patterned substrate 192. A pattern periodicity of $\lambda/(2n)$ is chosen to provide selective feedback, due to Bragg reflections, at a wavelength within the medium gain band. A pump beam can be directed either perpendicular to the substrate, vertical pump 194, or parallel to the substrate, edge pump 196. At pump intensities below the lasing threshold (sub-threshold pump), the system acts as a regenerative optical amplifier. At pump intensities exceeding the lasing threshold, the system acts as a distributed feedback laser.

Figure 4:
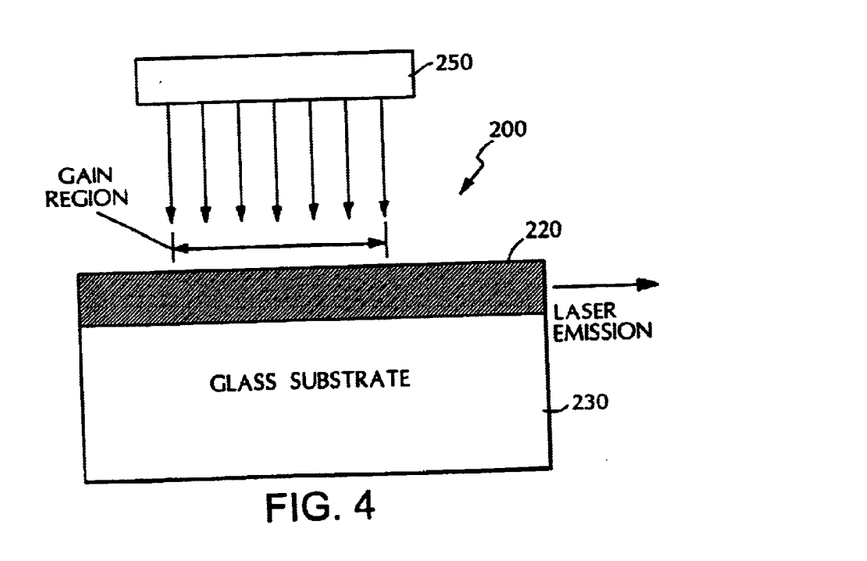
FIG. 4 is a schematic diagram of an experiment for the observation of amplified spontaneous emission developing in a nanocrystal solid in a waveguiding regime.

Referring to FIG. 4, a laser 200 includes a gain medium 220 disposed on a substrate 230. Gain medium 220 acts as a waveguide that supports the propagation of waveguide modes due to total internal reflection, i.e., laser 200 does not require external components to form a cavity and supply feedback. Total internal reflection occurs in gain medium 220 since the concentrated semiconductor nanocrystal solids have an index of refraction greater than that for both the substrate, air, and vacuum. In operation, an external source 250 excites gain medium 220 to produce a population inversion. Spontaneous emission from the semiconductor nanocrystals propagating in waveguide modes of the medium is amplified. If the gain medium is of sufficient length, so that G L>>1, lasing action occurs.

The following examples are intended as illustrative only, since numerous modifications and variations will be apparent to those skilled in the art.

EXAMPLE 1

Figure 5:
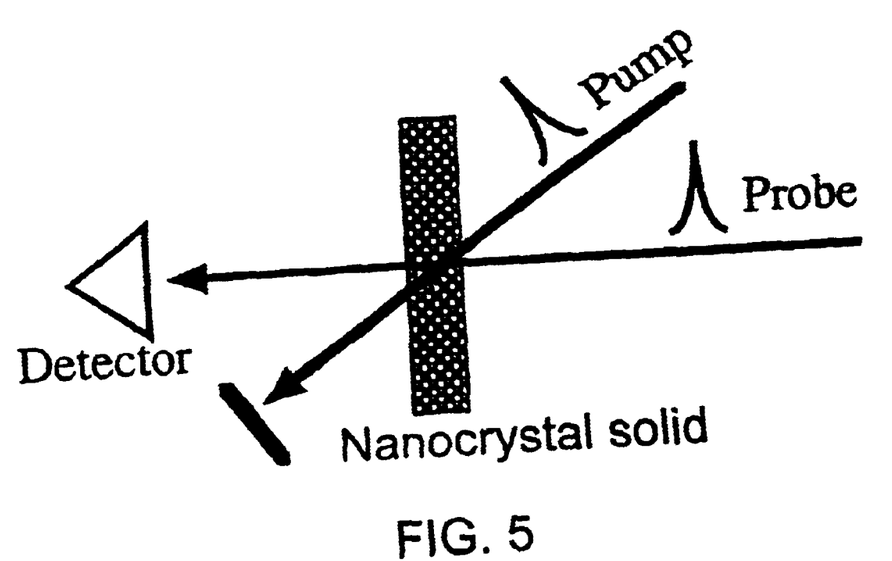
FIG. 5 is a schematic diagram of a pump-probe laser experiment for measuring gain.
Figure 6A:
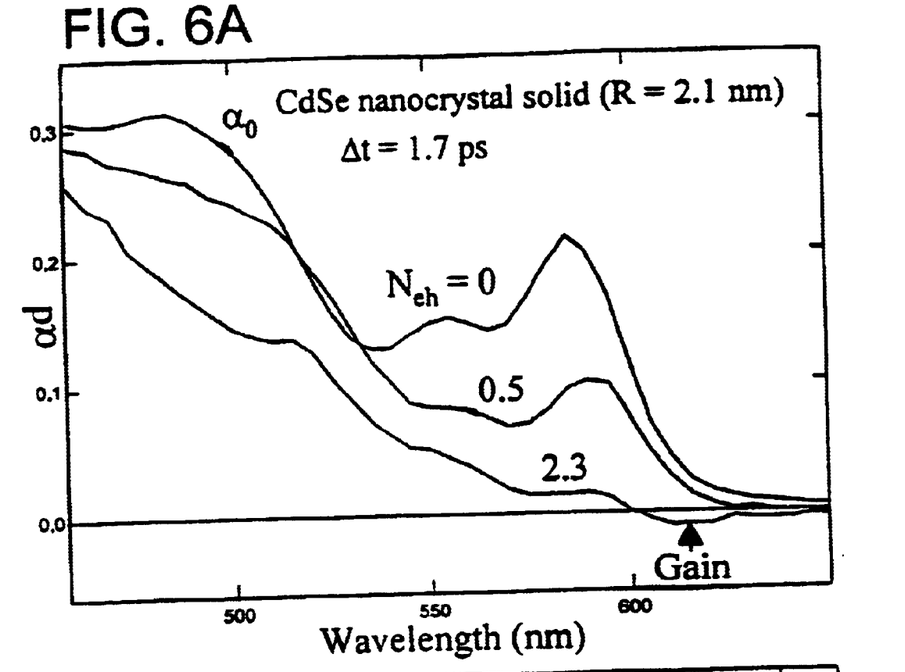
FIG. 6A is a plot illustrating absorption/gain spectra of a CdSe quantum dot solid (dot diameter 4.2 nm) recorded via the pump-probe laser experiment of FIG. 5.
Figure 6B:
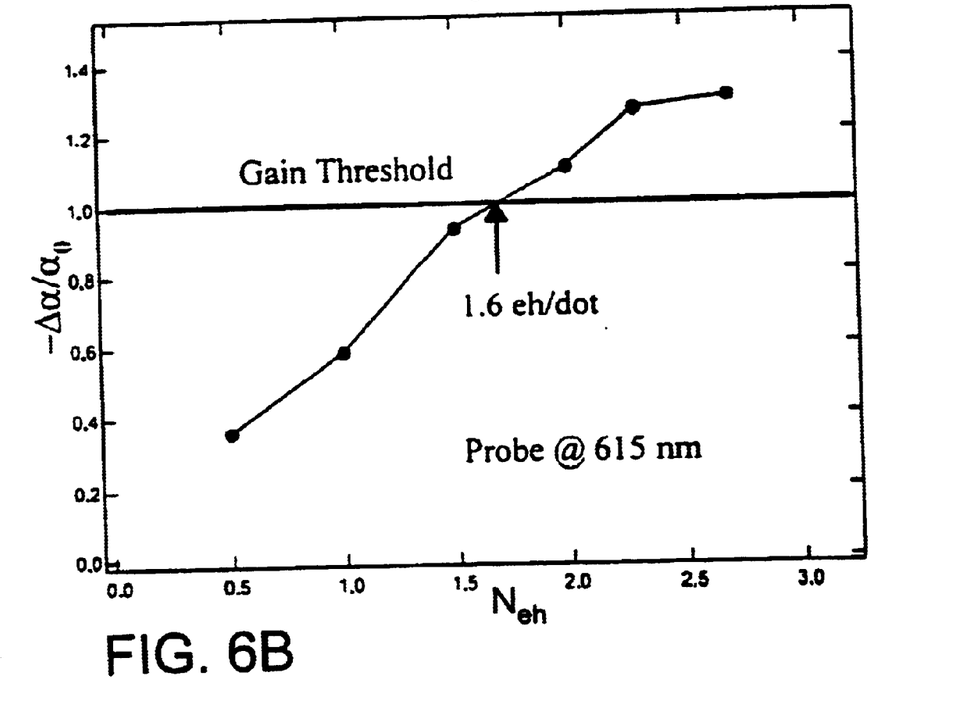
FIG. 6B is a plot of normalized absorption bleaching ($-\Delta\alpha/\alpha_o$) versus the number of electron-hole pairs ($N_{eh}$) excited per semiconductor nanocrystal.

Optical gain (amplification of light) was detected using a femtosecond pump-probe experiment illustrated in FIG. 5 and described by Klimov et al. in Opt. Lett., vol. 23, p. 277 (1998). A gain medium of CdSe semiconductor nanocrystals with TOP/TOPO surface groups was formed into a concentrated solid, i.e., film of close-pack semiconductor nanocrystals, on a glass substrate. The semiconductor nanocrystals had a diameter of about 4.2 nm and the film thickness was between about 0.2 microns and 10 microns. The gain medium was cooled down to liquid nitrogen temperature (T=77K). To create the inversion of population, the gain medium was excited at 3 eV by 100-femtosecond frequency-doubled "pump" pulses from an amplified Ti-Sapphire laser. The absorption/gain in the photoexcited spot was probed using variably delayed broad-band "probe" pulse of femtosecond "white-light" continuum generated in a sapphire plate. Referring to FIG. 6A, sample absorption spectra $\alpha d$ (where $\alpha$ is the absorption coefficient and d is the thickness of the absorbing layer) were recorded as a function of wavelength. Spectra recorded with excitation pulses are shown as dashed and dashed-dotted lines and spectra recorded without excitation pulses are shown as solid lines. The excitation pulse dependence of absorption bleaching at energies of about 615 nm is shown in FIG. 6B. The densities of the excitation pulses are indicated in numbers of photo-excited electron-hole (e-h) pairs per quantum dot on average ($N_{eh}$) Optical gain (negative absorption) was observed at an excitation pulse density of about 1.6 e-h pairs per nanocrystal. The maximum gain detected was about 1000 cm$^{-1}$ ($N_{eh}$=2.7). For the nanocrystal size used in this experiment, optical amplification was observed in the spectral range from about 600 nm to about 650 nm. Optical gain was also detected at room temperature at densities of $N_{eh}$>2.

Figure 7:
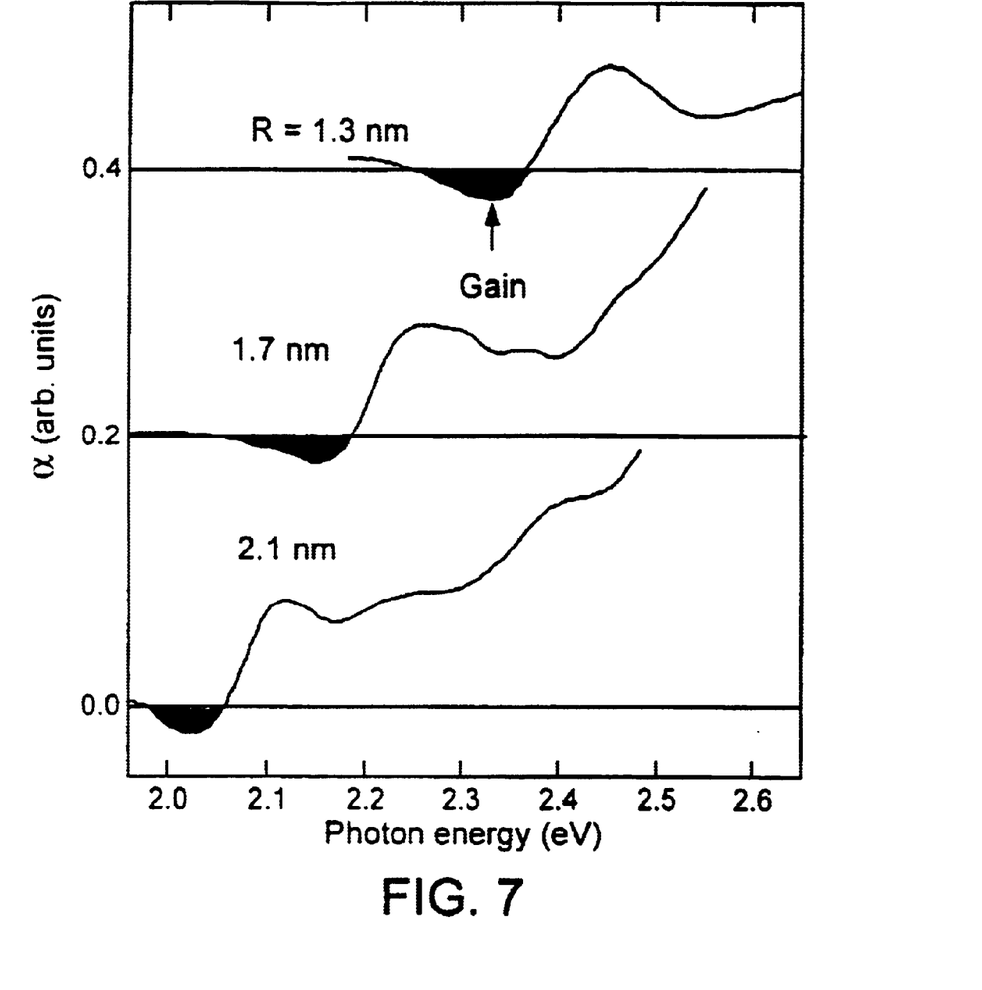
FIG. 7 is a plot of optical absorption/gain spectra recorded at room temperature.

FIG. 7 is a plot of optical absorption/gain spectra recorded at room temperature for three concentrated solids fabricated from CdSe nanocrystals having radii, R, of 1.3 nm, 1.7 nm, and 2.1 nm.

EXAMPLE 2

Figure 8:
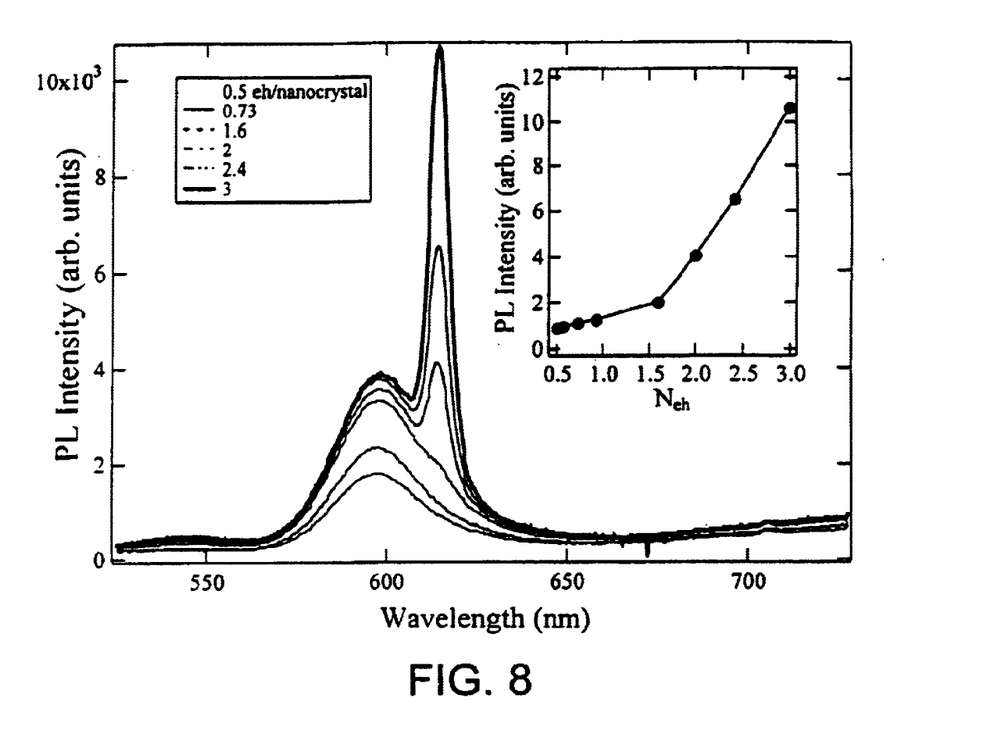
FIG. 8 is a plot of photoluminescence intensity versus wavelength depicting the development of stimulated emission.

Amplified spontaneous emission was detected in a single pass configuration, such as described with respect to FIG. 4, in a waveguide regime. A concentrated solid of semiconductor nanocrystals, i.e., a film of closely packed nanocrystals (thickness of 460 nm) was deposited on a glass slide. The semiconductor nanocrystals were CdSe, had a diameter of 4.2 nm, and were surface passivated with trioctylphosphine oxide and trioctylphosphine selenide. The film serves as a waveguide. Because the refractive index of the film (about 1.8) was greater than that for both the refractive index of the glass slide (about 1.4) and the vacuum/air (about 1), the film supported waveguide modes which propagated in a low-loss regime of total internal reflection. The pump spot was around 1 millimeter in diameter. The gain medium was cooled down to liquid nitrogen temperature (T=77K). Emission spectra of the film were recorded at progressively higher excitation pulse intensities and are shown in FIG. 8. Development of a sharp laser mode at 615 nm at pump levels of about 2 e-h pairs per dot on average were observed. The excitation pulse-intensity dependence of this peak (inset of FIG. 8) indicates a threshold-type behavior, typical of a transition to a lasing regime.

Figure 9A:
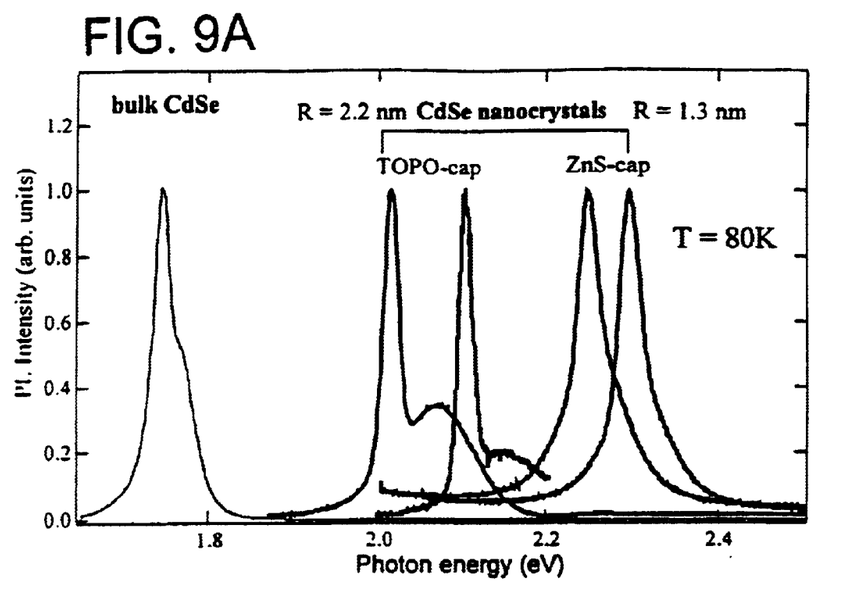
FIG. 9 is a plot of size-controlled spectra of stimulated emission for solids of CdSe nanocrystals of different sizes in comparison to the spectra of stimulated (A; T=80K) and spontaneous (B; T=300K) emission of bulk CdSe.
Figure 9B:
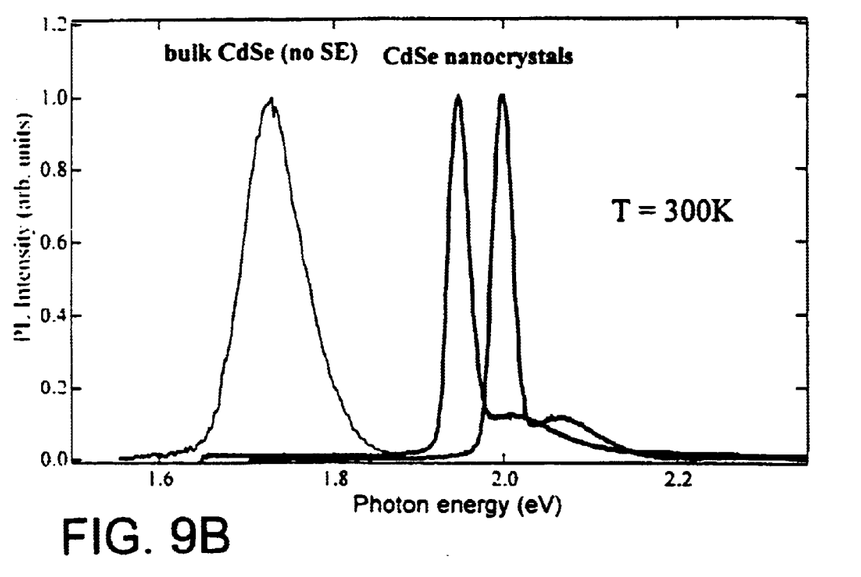

FIG. 9 is a plot of size-controlled spectra of stimulated emission for solids of CdSe nanocrystals of different sizes in comparison to the spectra of stimulated (A) and spontaneous (B) emission of bulk CdSe. The spectra were taken at T=80K (A) and 300K (B). Bulk CdSe does not show stimulated emission at room temperature, whereas concentrated solids of CdSe nanocrystals show stimulated emission.

A number of embodiments have been described. Nevertheless, it will be understood that various modifications may be made. For example, concentrated solids of semiconductor nanocrystals can used as a gain medium with cavities formed by distributed Bragg reflectors (DBR). Accordingly, other embodiments are within the scope of the following claims.

What is claimed is:

1. A laser comprising:
   an optical gain medium comprising a concentrated solid including a plurality of semiconductor nanocrystals, the plurality of semiconductor nanocrystals being close-packed; and
   a cavity arranged relative to the optical gain media to provide feedback, wherein the concentrated solid provides gain to an optical signal at an energy equal to or less than the maximum band gap emission of the nanocrystals.

2. The laser of claim 1, wherein each of the plurality of semiconductor nanocrystals includes a same or different first semiconductor material selected from the group consisting of a Group II–VI compound, a Group II–V compound, a Group III–VI compound, a Group III–V compound, a Group IV–VI compound, a Group I–III–VI compound, a Group II–IV–VI compound, and a Group II–IV–V compound.

3. The laser of claim 2, wherein each first semiconductor material is overcoated with a second semiconductor material.

4. The laser of claim 3, wherein each first semiconductor material has a first band gap and each second semiconductor material has a second band gap that is larger than the first band gap.

5. The laser of claim 3, wherein each second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

6. The laser of claim 2, wherein each first semiconductor material is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, TlSb, TlN, TlP, TlAs, TlSb, PbS, PbSe, PbTe, and mixtures thereof.

7. The laser of claim 1, wherein the plurality of nanocrystals have an rms deviation in diameter of less than 15%.

8. The laser of claim 1, wherein each nanocrystal has a diameter of less than about 10 nanometers.

9. A method of amplifying an optical signal comprising:
   directing an optical beam into a gain medium including a concentrated solid including a plurality of semiconductor nanocrystals, the plurality of semiconductor nanocrystals being close-packed and having an rms deviation in diameter of less than 15% wherein the concentrated solid is substantially free of defects and provides gain to the optical signal at an energy equal to or less than the maximum band gap emission of the nanocrystals when excited by a source.

10. The method of claim 9, wherein each of the plurality of semiconductor nanocrystals includes a same or different first semiconductor material selected from the group consisting of a Group II–VI compound, a Group II–V compound, a Group III–VI compound, a Group III–V compound, a Group IV–VI compound, a Group III–VI compound, a Group II–IV–VI compound, and a Group II–IV–V compound.

11. The method of claim 10, wherein each first semiconductor material is overcoated with a second semiconductor material.

12. The method of claim 11, wherein each first semiconductor material has a first band gap and each second semiconductor material has a second band gap that is larger than the first band gap.

13. The method of claim 11, wherein each second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

14. The method of claim 10, wherein each first semiconductor material is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, TlSb, TlN, TlP, TlAs, TlSb, PbS, PbSe, PbTe, and mixtures thereof.

15. The method of claim 9, wherein each nanocrystal has a diameter of less than about 10 nanometers.

16. A method of forming a laser comprising:
    arranging a cavity relative to an optical gain medium to provide feedback to the optical gain medium, wherein the optical gain medium comprises a concentrated solid including a plurality of semiconductor nanocrystals, the plurality of semiconductor nanocrystals being close packed.

17. The method of claim 16, wherein each of the plurality of semiconductor nanocrystals includes a same or different first semiconductor material selected from the group consisting of a Group II–VI compound, a Group II–V compound, a Group III–VI compound, a Group III–V compound, a Group IV–VI compound, a Group I–III–VI compound, a Group II–IV–VI compound, and a Group II–IV–V compound.

18. The method of claim 17, wherein each first semiconductor material is overcoated with a second semiconductor material.

19. The method of claim 18, wherein each second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, TlSb, PbS, PbSe, PbTe, or mixtures thereof.

20. The method of claim 17, wherein each first semiconductor material has a first band gap and each second semiconductor material has a second band gap that is larger than the first band gap.

21. The method of claim 17, wherein each first semiconductor material is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, TlSb, TlN, TlP, TlAs, TlSb, PbS, PbSe, PbTe, and mixtures thereof.

22. The method of claim 16, wherein the plurality of nanocrystals have an rms deviation in diameter of less than 15%.

23. The method of claim 16, wherein each nanocrystal has a diameter of less than about 10 nanometers.

24. A laser comprising:
    an optical gain medium comprising a concentrated solid including a plurality of colloidally grown semiconductor nanocrystals, the plurality of semiconductor nanocrystals being close-packed and having an rms deviation in diameter of less than 15%; and
    a cavity arranged relative to the optical gain media to provide feedback, wherein the concentrated solid provides gain to an optical signal at an energy equal to or less than the maximum band gap emission of the nanocrystals.

25. The laser of claim 24, wherein each of the plurality of semiconductor nanocrystals includes a same or different first semiconductor material selected from the group consisting of a Group II–VI compound, a Group II–V compound, a Group III–VI compound, a Group III–V compound, a Group IV–VI compound, a Group I–II–VI compound, a Group II–IV–VI compound, and a Group II–IV–V compound.

26. The laser of claim 25, wherein each first semiconductor material is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, TlSb, TlN, TlP, TlAs, TlSb, PbS, PbSe, PbTe, and mixtures thereof.

27. The laser of claim 25, wherein each first semiconductor material is overcoated with a second semiconductor material.

28. The laser of claim 27, wherein each first semiconductor material has a first band gap and each second semiconductor material has a second band gap that is larger than the first band gap.

29. The laser of claim 27, wherein each second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

30. The laser of claim 24, wherein each nanocrystal has a diameter of less than about 10 nanometers.

31. The laser of claim 24, wherein the concentrated solid including a plurality of colloidally grown semiconductor nanocrystals is disposed on a substrate, wherein the substrate is made from a material that does not react with the nanocrystals.

32. The laser of claim 24, wherein the colloidally grown semiconductor nanocrystals are substantially spherical in shape.

33. A method of amplifying an optical signal comprising:
directing an optical beam into a gain medium including a concentrated solid including a plurality of colloidally grown semiconductor nanocrystals, the plurality of semiconductor nanocrystals being close-packed and having an rms deviation in diameter of less than 15%, wherein the concentrated solid is substantially free of defects and provides gain to the optical signal at an energy equal to or less than the maximum band gap emission of the nanocrystals when excited by a source.

34. The method of claim 33, wherein each of the plurality of semiconductor nanocrystals includes a same or different first semiconductor material selected from the group consisting of a Group II–VI compound, a Group II–V compound, a Group III–VI compound, a Group III–V compound, a Group IV–VI compound, a Group I–III–VI compound, a Group II–IV–VI compound, and a Group II–IV–V compound.

35. The method of claim 34, wherein each first semiconductor material is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, TlSb, TlN, TlP, TlAs, TlSb, PbS, PbSe, PbTe, and mixtures thereof.

36. The method of claim 34, wherein each first semiconductor material is overcoated with a second semiconductor material.

37. The method of claim 36, wherein each first semiconductor material has a first band gap and each second semiconductor material has a second band gap that is larger than the first band gap.

38. The method of claim 36, wherein each second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

39. The method of claim 33, wherein each nanocrystal has a diameter of less than about 10 nanometers.

40. The method of claim 33, wherein the concentrated solid including a plurality of colloidally grown semiconductor nanocrystals is disposed on a substrate, wherein the substrate is made from a material that does not react with the nanocrystals.

41. The method of claim 33, wherein the colloidally grown semiconductor nanocrystals are substantially spherical in shape.

42. A method of forming a laser comprising:
arranging a cavity relative to an optical gain medium to provide feedback to the optical gain medium, wherein the optical gain medium comprises a concentrated solid including a plurality of colloidally grown semiconductor nanocrystals, the plurality of semiconductor nanocrystals being close packed and having an rms deviation in diameter of less than 15%.

43. The method of claim 42, wherein each of the plurality of semiconductor nanocrystals includes a same or different first semiconductor material selected from the group consisting of a Group II–VI compound, a Group II–V compound, a Group III–VI compound, a Group III–V compound, a Group II–VI compound, a Group I–III–VI compound, a Group II–IV–VI compound, and a Group II–IV–V compound.

44. The method of claim 43, wherein each first semiconductor material is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, TlSb, TlN, TlP, TlAs, TlSb, PbS, PbSe, PbTe, and mixtures thereof.

45. The method of claim 43, wherein each first semiconductor material is overcoated with a second semiconductor material.

46. The method of claim 45, wherein each second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

47. The method of claim 43, wherein each first semiconductor material has a first band gap and each second semiconductor material has a second band gap that is larger than the first band gap.

48. The method of claim 42, wherein each nanocrystal has a diameter of less than about 10 nanometers.

49. The method of claim 42, wherein the concentrated solid including a plurality of colloidally grown semiconductor nanocrystals is disposed on a substrate, wherein the substrate is made from a material that does not react with the nanocrystals.

50. The method of claim 42, wherein the colloidally grown semiconductor nanocrystals are substantially spherical in shape.

* * * * *